United States Patent

Norton

[11] Patent Number: 5,844,412
[45] Date of Patent: Dec. 1, 1998

[54] BOARD TEST APPARATUS AND METHOD FOR FAST CAPACITANCE MEASUREMENT

[75] Inventor: Peter R. Norton, Berkeley, Calif.

[73] Assignee: Teradyne, Inc., Boston, Mass.

[21] Appl. No.: 769,556

[22] Filed: Dec. 19, 1996

[51] Int. Cl.⁶ .................................................. G01R 27/26
[52] U.S. Cl. ........................ 324/548; 324/765; 324/523; 702/65
[58] Field of Search .................................. 324/519, 522, 324/523, 527, 537, 548, 765; 364/482; 702/64, 65

[56] References Cited

U.S. PATENT DOCUMENTS

| | | | |
|---|---|---|---|
| 4,196,475 | 4/1980 | Hall | 364/482 |
| 4,795,966 | 1/1989 | Cook | 324/548 |
| 5,101,106 | 3/1992 | Cox, Jr. et al. | 324/548 |
| 5,212,454 | 5/1993 | Proebsting | 324/765 |
| 5,450,014 | 9/1995 | Lee | 324/548 |
| 5,469,364 | 11/1995 | Hughey et al. | 364/482 |
| 5,579,236 | 11/1996 | Tamamura et al. | 364/483 |

FOREIGN PATENT DOCUMENTS

| | | | |
|---|---|---|---|
| 722 091 | 7/1996 | European Pat. Off. | G01R 31/312 |
| 759 559 | 2/1997 | European Pat. Off. | G01R 31/28 |

*Primary Examiner*—Josie Ballato
*Assistant Examiner*—Diep Do
*Attorney, Agent, or Firm*—Edmund J. Walsh

[57] ABSTRACT

A printed circuit board tester incorporating hardware for fast capacitive measurements. The circuit board tester includes a digital signal processor that can both source and measure test signals. It also includes an amplifier having an input and an output connected to probes that can contact points on the printed circuit board. In use, the board tester is configured to place a capacitor on the printed circuit board under test in the feedback path of the amplifier. The digital signal processor generates a stimulus signal to the capcitor and the output of the amplifier is passed to the digital signal processor. The digital signal processor uses an adaptive filtering approach to determine convergence of the measurement, thereby minimizing measurement time. The arrangement is flexible and can be reconfigured to measure both large and small values of capacitance.

9 Claims, 3 Drawing Sheets

BOARD TEST APPARATUS AND METHOD FOR FAST CAPACITANCE MEASUREMENT

This invention relates generally to testing of printed circuit boards and more specifically to the measurement of capacitance during a test of a printed circuit board.

Printed circuit boards are generally tested during their manufacture. Testing is intended to detect a range of defects. For example, tests are often run to verify that the correct components are attached to the printed circuit board. Other tests are often run to check for short circuits between various conductive traces on the board.

Board testers are commercially available. For example, Teradyne, Inc. of Walnut Creek, Calif. USA sells board testers, such as its Z1800 tester. These testers include a "Bed of nails" fixture containing many probes that make contact with a printed circuit board placed on the fixture. Circuitry inside the tester connected to the bed of nails generates and measures test signals on the printed circuit board. These measurements are used by a controller within the tester to detect circuit boards that are not operating properly.

Various circuits are included inside the tester to measure or generate the signals needed to detect many types of faults on printed circuit boards under test. Some circuitry generates digital signals to test digital components on the printed circuit board under test.

Other circuitry can generate and measure analog signals. For example, devices to measure current and voltage are generally included. To allow generation of many analog wave forms, many printed circuit board testers include digital signal processing chips programmed to generate sine waves or other analog wave forms. These same digital signal processing chips can also be operated to filter analog signals for more accurate measurements.

It is desirable that measurements be made as quickly as possible. Fast measurement techniques are needed so that the throughput of the printed circuit board manufacturing operation is not decreased by testing. Otherwise, the manufacturing operation could become unprofitable. It is therefore desirable to increase the speed of testing to the greatest extent possible.

One area where speed improvement would be desirable is in the testing of capacitors on printed circuit boards. The traditional approach to measuring capacitance is to make connection to the printed circuit board at the two points where the leads of the capacitor should be connected. A current stimulus is applied to these two points and the resulting voltage is measured. In some instances, multiple samples will be taken very rapidly and averaged to eliminate noise. After a delay, which is typically about a tenth of a second, the voltage is measured again. The two voltage measurements are used to compute the rate of increase of the capacitor voltage. From fundamental physical principles, the capacitance is proportional to the delay interval divided by the change in voltage over that interval where the constant of proportionality includes the capacitance and stimulus current, both of which are assumed to be fixed. When the computed capacitance is in the expected range, it can be determined that a capacitor is present.

The drawback of this approach is that it takes about one tenth of a second for each capacitor on the board. The entire time allotted to testing an entire printed circuit board is generally on the order of a few seconds. Thus, if there are even a few large capacitors on the board, much of the allotted time is taken up testing capacitors.

However, it would be desirable to improve the test speed without requiring the addition of expensive components to a circuit board tester.

SUMMARY OF THE INVENTION

With the foregoing background in mind, it is an object of the invention to provide a rapid method for measuring capacitance on a printed circuit board.

It would also be desirable to measure capacitance without significantly increasing cost.

The foregoing and other objects are achieved by using a board tester with a digital signal processor. The digital signal processor generates a test signal which is applied across the capacitor on the printed circuit board. The voltage across the capacitor is sampled and provided to a digital signal processor. The digital signal processor calculates a slope of a line of best fit to the sampled data, allowing a computation of the capacitance. When the computed capacitance values converge, the measurement is complete. If the values are not equal, further measurements are taken until the values converge.

In a preferred embodiment, the digital signal processor is also used for signal filtering and test signal generation as found in a conventional tester, thereby reducing the amount of hardware needed to perform the capacitance measurements.

BRIEF DESCRIPTION OF THE DRAWINGS

The invention will be better understood by reference to the following more detailed description and accompanying drawings in which.

DESCRIPTION OF THE PREFERRED EMBODIMENT

Figure 1:
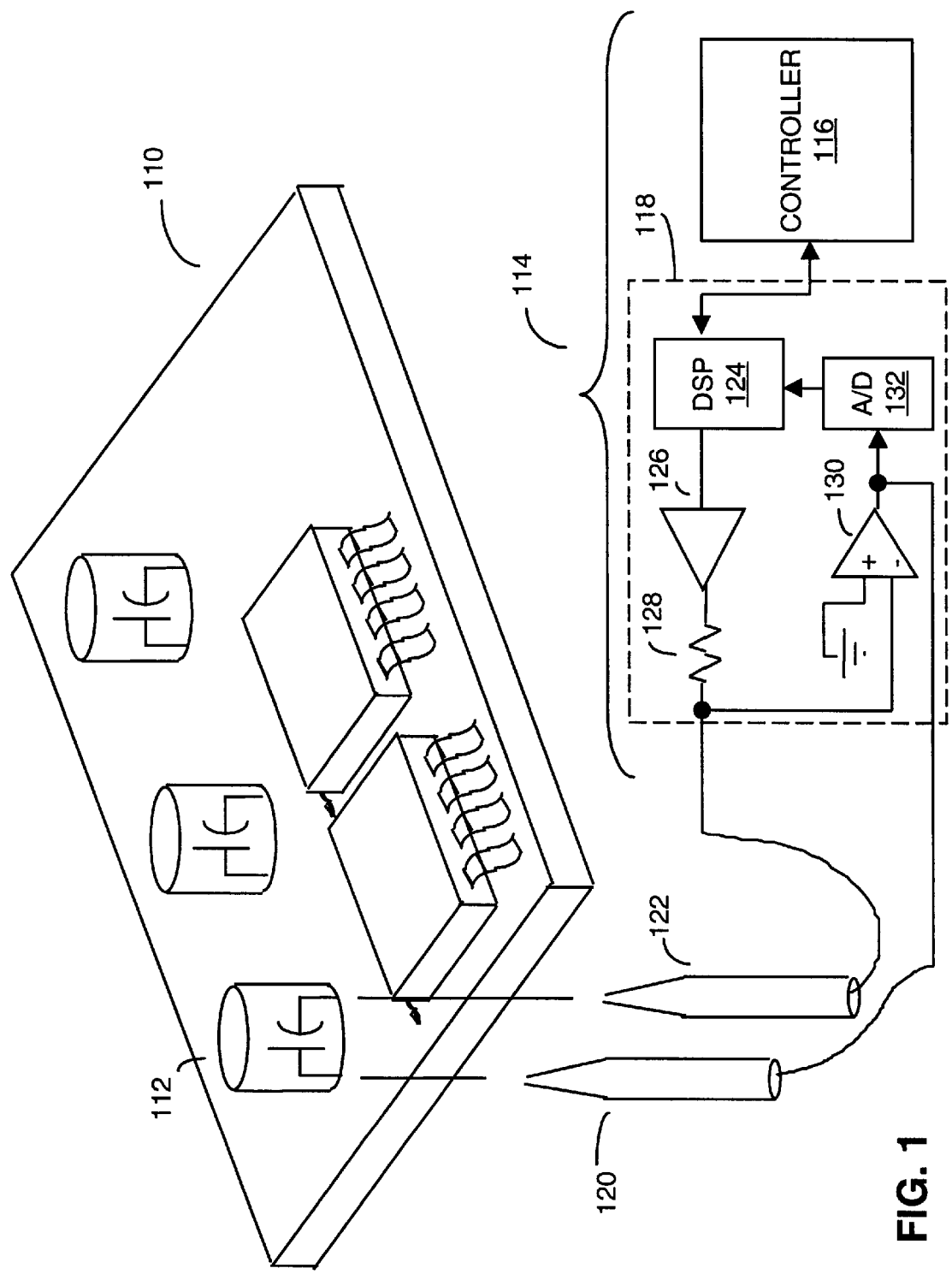
FIG. 1 is a sketch showing a printed circuit board tester configured to employ the invention.

FIG. 1 shows a printed circuit board under test 110. To board under test 110 are mounted numerous components, such as capacitor 112. Tester 114 is used to measure the capacitance of capacitor 112.

Tester 114 could be a printed circuit board tester as in the prior art modified to include the software and hardware described herein. Tester 116 includes controller 116 that controls the hardware components of tester 114. As in the prior art, controller 116 also analyzes measured data and reports detected faulty printed circuit boards. Controller 116 is shown schematically as a single element. However, controller 116 could be multiple microprocessors and microcontrollers distributed throughout tester 114. Controller 116 is programmed with software to control tester 114 as herein described.

Tester 114 also includes an analog data acquisition circuit 118. Likely, analog data acquisition circuit 118 is fabricated on a printed circuit board connected to controller 116 over a bus (not numbered), allowing control information and data to be passed between analog data acquisition circuit 118 and controller 116. Such a board would contain the circuitry to generate and measure analog signals as in the prior art.

FIG. 1 shows two probes 120 and 122 used to measure capacitance according to the invention. Probes 120 and 122 are connected to analog data acquisition circuit 118 and are positioned to make contact with printed circuit board 110 at the points where the leads of capacitor 112 connect to printed circuit board 110.

Probes 120 and 122 could be a portion of a bed of nails fixture as in the prior art. They could alternatively be robotically positioned probes in what is sometimes called a "flying prober." However, any means of making connection to printed circuit board under test 110 is acceptable. In a preferred embodiment, there would likely be multiple probes connected to analog data acquisition circuit 118 through a switch matrix (not shown). The switch matrix allows probes 120 and 122 to be connected to other circuitry within tester 114. A switch matrix also allows analog data acquisition circuit 118 to be connected to other probes (not shown), thereby allowing the capacitance of other capacitors on printed circuit board 110 to be measured.

Probes 120 and 122 are connected to analog data acquisition circuit 118. Probe 122 carries a test signal to capacitor 112. The test signal is generated by digital signal processor (DSP) 124. As in prior art testers, DSP 124 can be programmed by controller 116 to generate either a sinusoidal signal, a constant signal or many other types of signals. In the embodiment shown in FIG. 1, DSP 124 generates a constant signal.

In a preferred embodiment, DSP 124 can perform multiple operations in parallel. It is preferred that it be capable of simultaneously generating at least one signal and processing samples of at least one signal. A suitable digital signal processor is the model TMS 320C31 sold by Texas Instruments. In addition to generating a test signal such a digital signal processor can also perform processing as described below.

The output of DSP 124 is provided to the input of transconductance amplifier 126. Transconductance amplifier 126, in response to a constant input, produces a constant output current. The output of transconductance amplifier 126 is passed through resistor 128 via probe 122 to one lead of capacitor 112. A typical value for resistor 128 is 100Ω.

Probe 122 is also connected to the inverting input of a measurement operational amplifier 130. Probe 120, connected to the other lead of capacitor 112, is connected to the output of operational amplifier 130. This configuration connects capacitor 112 in a feedback path for amplifier 130, causing the output of amplifier 130 to have a voltage equal to the voltage across capacitor 112. In this configuration, amplifier 130 is configured as an integrator circuit, which serves to reduce the effects of electrical noise in the measurements.

The output of amplifier 130 is passed to analog to digital converter (A/D) 132. A/D 132 takes samples at a relatively fast rate. In a preferred embodiment, the sampling interval is 10 microseconds.

The sampled signals are passed to DSP 124. As mentioned above, in the preferred embodiment, DSP 124 can process one signal while generating another. Thus, DSP 124 is utilized to both generate the stimulus signal and process the measured signal. The output of DSP 124 is passed to controller 116. This value is used to determine the capacitance of capacitor 112.

The APPENDIX contains a program listing of the program used to control DSP 124. The APPENDIX gives a preferred embodiment, but many other embodiments might also be possible.

Figure 3:
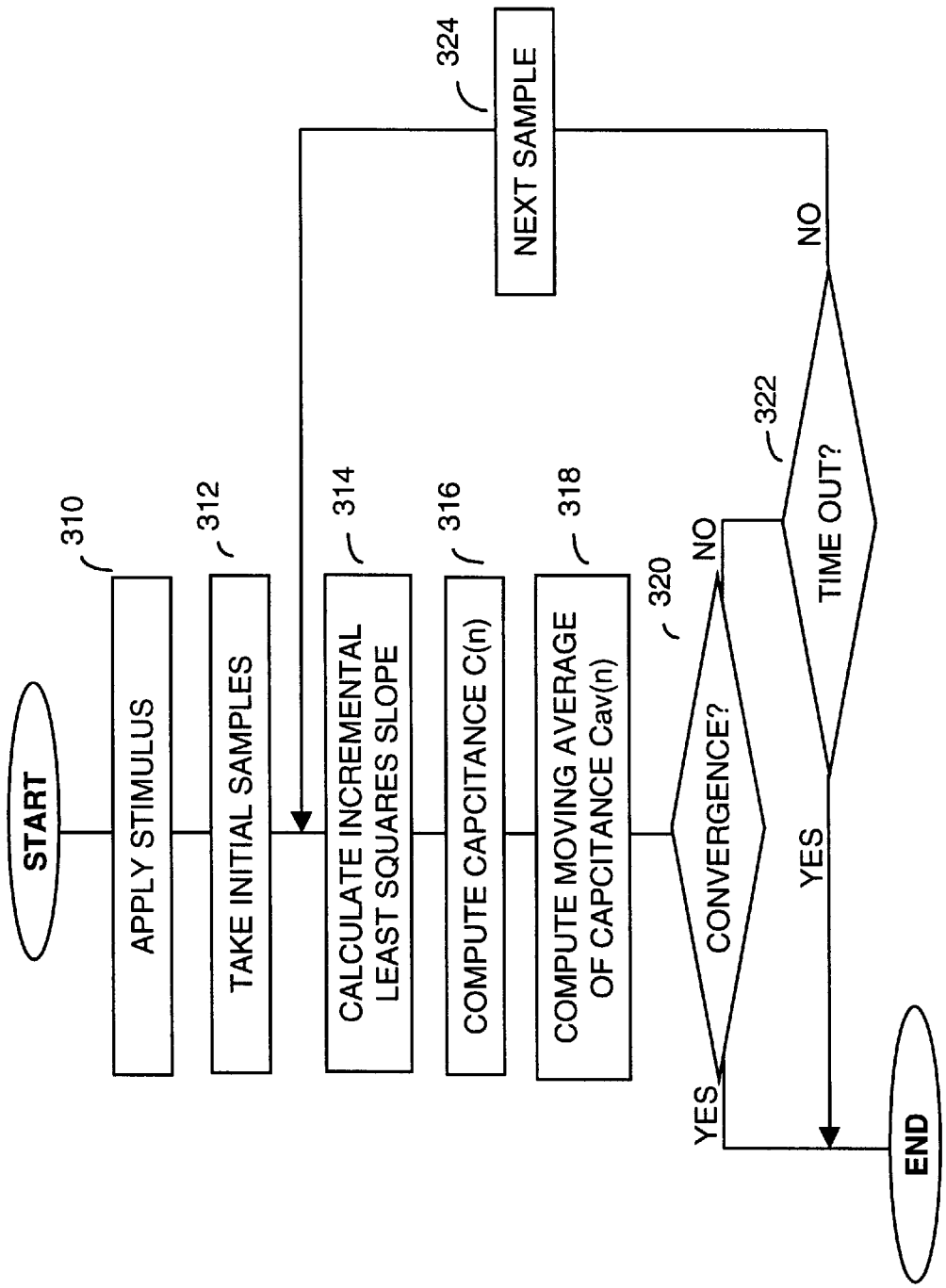
FIG. 3 is a flow chart showing the process performed by a printed circuit board tester incorporating the invention.

FIG. 3 shows the process performed by tester 114 to measure capacitance. Controller 116 sets up the hardware elements within tester 114 and then initiates a measurement, the steps of which are controlled by DSP 124.

At step 310, the stimulus is applied to capacitor 112. In a preferred embodiment, a constant current of approximately 5 mA is used as a stimulus. This current is controlled by programming the output of DSP 124 that is connected to transconductance amplifier 126.

At step 312, an initial set of samples is taken. The samples are taken by A/D 132. In a preferred embodiment, the initial samples are taken over an interval that is 10 msec.

At step 314, the recursive least squares slope of the derivative of all the samples collected is computed. This computation is performed using a well known process. A least squares process determines the slope of a line that minimizes the square of the distance between each sample and the line. The derivative of the samples is used for the computation to compensate for the fact that amplifier 130 is configured as an integrator.

An incremental process operates on samples in an iterative process. At each iteration, the slope of the line computed at the prior iteration is adjusted based on the new sample set without reprocessing the samples from prior iterations. However, the result is the same as would be obtained by performing a least squares process on all of the samples together. Thus, the output of step 314 is a series of values, one for each sample taken, reflecting the capacitance computed using the preceding samples.

Step 316 computes the value of capacitance based on the slope computed at step 314. The slope computed at step 314 is a change in voltage per unit time, i.e. dV/dt. Dividing the stimulus current by the slope yields a capacitance.

At step 318 an average value of the computed capacitance is calculated. In a preferred embodiment, the average is a moving average computed over a 5 msec interval. When the initial samples are processed, this average represents the average of the computed capacitances after each of the last 5 msec of samples were processed at step 314.

At step 320, a check is made as to whether the computed capacitance values have converged. If the moving average computed at step 318 is within 2% of the capacitance computed at step 316, then the capacitance measurement has converged. Program execution then ends. By stopping the measurement process when convergence is reached, it is likely that the measurement will be made in much less time than prior art measurements.

If the capacitance computation has not converged, then execution proceeds to step 322. At step 322, a check is made whether the measurement process has timed out. If the process has timed out, the measurement process also ends. In a preferred embodiment, the process will be repeated for one tenth of a second. This time is the same as the prior art measurement time. Thus, if the solution does not converge, the measurement will take no longer than the prior art. In addition, the measurement will be at least as accurate as the prior art measurement.

If the process has neither converged nor timed out, then execution proceeds to step 324. At step 324, another sample is taken. The process of FIG. 3 is ideally implemented such that step 324 is executed at a periodic rate, which, for the preferred embodiment, is 10 microseconds. The new sample value is used to compute a new least square slope at step 314. That slope is used to computed a new capacitance at step 316 and a new moving average of capacitances at step 318. The process is repeated in this fashion until the capacitance value either converges or times out.

It should be appreciated that a least squares computation at step 314 acts as a noise filter. As more samples are taken, noise associated with the samples should average out. Thus, as more samples are collected, the least squares estimate of capacitance becomes more accurate. The goal of the process described by FIG. 3 is to adaptively determine when sufficient samples have been taken that the least squares estimate is accurate enough.

In this way, a highly accurate measurement can be made in as short a time as possible. Test data has shown that measurement using the invention often takes on the order of one tenth the time of the prior art approach. The invention therefore offers a very rapid way to make capacitance measurements.

Having a quick way to make capacitance measurements can lead to more accurate board tests. One example of this is in tests to detect the presence of short circuits. During board tests, tests are often run to verify that shorts which are supposed to be present are in fact present. Other checks are run to verify that points which are not intended to be connected are not shorted.

Short tests are usually made by placing a voltage across the two points and measuring the current flow. If there is a high current flow, then the two points are deemed to be shorted. The drawback of this approach is that a large capacitor connected between the two points, then a charging current will flow into the capacitor and make it appear as if the two points are connected. Thus, the presence of a capacitor disrupts the test for a short.

By using the technique of the invention, a quick check could be made of whether a capacitor is present. If the check shows that a capacitor is present, then it can be determined that the test result showing a short circuit are likely faulty.

Another example of the method leading top improved board tests is in detecting polarized capacitors that are inserted backwards. The detection of reversed polarized is difficult, and typically done using high-frequency coupling of stimulus signals to the outer shell of the capacitor, which requires a special test fixture for each capacitor. The method described herein could be adapted to detect such reversed capacitors provided there are not multiple such polarized capacitors connected in parallel. No external fixture is used. Rather, the nonlinearity of the charging voltage is measured. The nonlinearity would be a function of the polarity of the capacitor relative to the polarity of the stimulus voltage, due to the change in the capacitor's dielectric barrier with reverse bias voltage.

Having described one embodiment, numerous alternative embodiments or variations might be made. For example, the embodiment of FIG. 1 is most useful in conjunction with measuring the value of large capacitors, such as capacitors greater than 50 microfarads.

Figure 2:
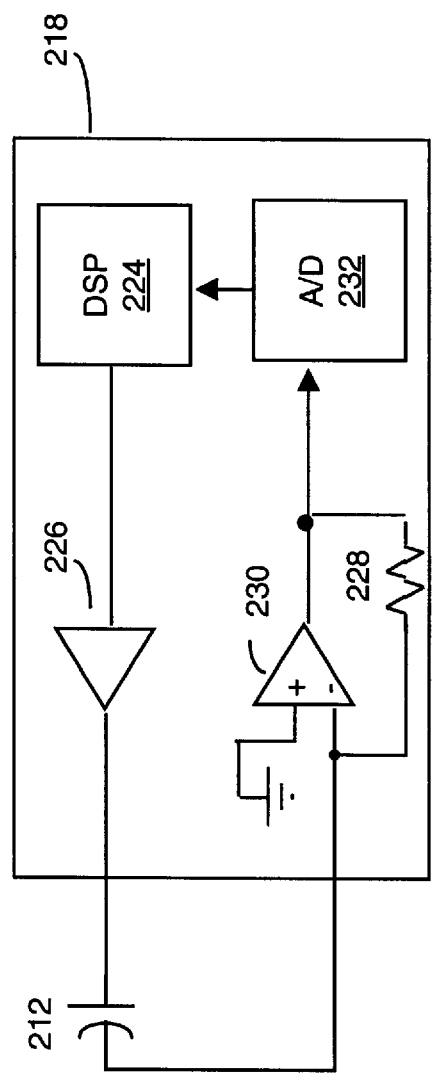
FIG. 2 is a sketch showing an alternative printed circuit board tester configuration according to the invention.

FIG. 2 shows an alternative embodiment of a data acquisition circuit 218 to measure small capacitor values. The embodiment of FIG. 2 contains a DSP 224, measurement amplifier 230, resistor 228 and A/D 232 which are identical to the corresponding elements in FIG. 1. However, in FIG. 2, the position of the capacitor 212 and the resistor 228 are reversed. Also, a voltage amplifier 226 is used in place of a transconductance amplifier. This configuration places resistor 228 in the feedback path of measurement amplifier 230, thereby producing a larger signal when capacitor 212 has a small value.

It is not required that the input stimulus be a constant current. DSP 124 could be used to generate other types of inputs, for example, a sine wave. In this case, the measured voltage would be a sine wave. At step 314, rather than compute the slope of the measured value, the measured values would be used to compute the amplitude of the sine wave. The amplitude would be used to compute the capacitance at step 316.

Further, specific numerical examples were given for the percentage change needed to define convergence, specific component values and other related concepts. Various alternative values will also work adequately.

Further, it was described that a special purpose digital signal processing chip is used to generate stimulus signals and to process the resulting samples. There are several advantages to this approach. It is a very fast way to perform the required signal analysis. In addition, the chip can perform other signal generation and analysis functions commonly performed by a tester. In this way, the cost of adding a powerful DSP chip to the tester is offset by the many other functions it can perform. However, a dedicated DSP chip is not required. A general purpose microprocessor or ASIC might be used.

Also, it was described that capacitance values are computed at step 316 from the measured voltage signal. The slope of the voltage signal could, however, be used as an equivalent of the capacitance. Once the computation of the slope of the voltage signal converged, that value could be easily converted to a capacitance. Alternatively, where the measured value is compared to some known value to determine whether a capacitor has a correct value, the known value could be stored as a slope of the voltage signal, thereby eliminating the need to convert the measured signal to units of capacitance at all.

As another example, it was described that measurements of the rate of change of the voltage across the capacitance are taken just until the measurements converge. This is a special case of a more general class of techniques known as adaptive digital filtering. Other adaptive digital filtering techniques might be employed in place of the specific technique described.

Finally, it was described that the invention is useful in testing printed circuit boards. Board testers are used for testing many similar electronic assemblies. For example, it might be used for testing multichip modules.

Therefore, the invention should be limited only by the spirit and scope of the appended claims.

APPENDIX

```
/* Code outline of Capacitor measurement algorithm
 * using recursive linear least squares
 * Peter R. Norton, Teradyne — Assembly Test Walnut Creek.
 * Copyright © Teradyne Inc.
 */
#define PIXI_CLK_PER     10.0e-6    /* sample interval */
typedef struct setuptag /* miscellaneous data needed for
configuration setup */
{
    int averaging;
    float rsohms;      /* series resistor */
    float pkv;         /* dac peak voltage */
} SETUP;
extern void DAC0_OUT(float);    /* set dac output */
extern float ADC_VOLTS();       /* measure adc volts */
extern void DCCapDischarge(void);    /* discharge the DUT */
/**************************************************************
 DVDTmeas    return measured DVDT estimated via linear least
 squares
 */
float
DVDTmeas
( SETUP *su      /* setup buffer ptr */ )
{
    int i;
    float fn, measv, dvdt, dvdtavg, mtime, err;
    float sumxf;                  /* accum sum(time*volts) */
    float sumx2;                  /* accum sum(time^2) */
    float sumx;                   /* accum sum(time) */
```

APPENDIX-continued

```
    float sumf;                     /* accum sum(volts) */
    float stime = PIXI_CLK_PER;
    float stime2= PIXI_CLK_PER*PIXI_CLK_PER;
    mtime = dvdtavg = measv = 0.0;
    fn = sumx = sumx2 = sumf = sumxf = 0.0;
    /* set dacs if DC and leave for entire measure cycle
    */
    DAC0_OUT(su—>pkv);
    /*
    ***************************** measure loop start
    */
    for(i=0; i<10000; i++)
    {
        /* input next V sample from ADC, scaled to volts at DUT
        */
        measv = ADC_VOLTS();
        fn += 1.0;
        mtime += stime;
        sumx += mtime;
        sumx2 += mtime*mtime;
        sumf += measv;
        sumxf += measv * mtime;
        /* formula for slope of linear least squares fit to
data series
        */
        dvdt = (fn*sumxf - sumf*sumx) / (fn*sumx2 - sumx*sumx);
        dvdt = fabs(dvdt);
        /* compute 200pt (2ms) moving average of slope estimate
        */
        dvdtavg = 0.995*dvdtavg + 0.005*dvdt;
        /* if have sampled dvdt for minimum of 10ms=1000
samples,
         * then see if stability of measured data is
acceptable, break if so
         * 'stable' = within 1% of moving average
         */
        if(i>1000)
        {
            err = fabs((dvdtavg - dvdt) / dvdtavg);
            if( err < 0.01)
                break;
        }
    } /*********************** measure loop end *********/
    return dvdt;
}
/***************************************************
 * CHARGEmeas DC Charge Rate measurement algorithm
 * do running estimate of least-squares linear estimation of
voltage slope dv/dt
 * with constant current stim I
 * then C = I/(dv/dt)
 * slope estimation math runs in foreground while voltage
measurement samples
 * accumulate in background, no need to keep up in real time
 * measurement stops when stability criterion is reached
 */
float
CHARGEmeas
(
    SETUP           *su   /* setup buffer ptr */
)
{
    int nm = su—>averaging;   /* number of measurments to
average */
    float rslt = 0.0;                /* measured result,
accumulated results */
    float mv;
    do
    {
        mv = DVDTmeas(su); /* return linear least squares fit
to DVDT */
        rslt += mv;
        /* discharge DUT to <20mv, fails if times out before
20mv
        */
        DCCapDischarge();
    } while (--nm && mv>0.0);
    if (su—>averaging > 1)
        rslt /= su—>averaging;
    /* convert delta-v to Capacitance C = I / dv/dt
     * if delta-v is 0.0 then adc clipped because dut is too
small
     */
    rslt =((su—>pkv/su—>rsohms) / rslt);
    return rslt;
}
void main(void)
{
    SETUP su;
    float cap_value;
    cap_value = CHARGEmeas(&su);   /* measure capacitor value
*/
}
```

What is claimed is:

1. A method of operating a printed circuit board tester to test a capacitance between two points, the method comprising the steps of:

a) connecting probes to the two points on the printed circuit board;

b) applying a dc stimulus signal between the two points;

c) initiating a sampling of a voltage signal between the two points;

d) using at least a portion of the samples to compute a first least squares estimate of the slope of the voltage signal at a first time;

e) using additional samples to compute a second least squares estimate of the slope of the voltage signal;

f) computing an average of at least a portion of the estimates of the slope of the voltage signal;

g) repeating steps e) and f) until the estimate of the slope at step e) differs from the average computed at step f) by less than a predetermined amount; and h) using the slope as an indication of the capacitance.

2. The method of claim 1 wherein the step of connecting probes comprises connecting a bed of nails fixture to the circuit board.

3. The method of claim 1 wherein the step of connecting probes comprises connecting a flying prober tester to the printed circuit board.

4. The method of claim 1 wherein the step of applying a stimulus comprises applying a stimulus signal from a digital signal processor.

5. The method of claim 4 wherein the step of computing an average comprises computing an average with the same digital signal processor that supplies the stimulus signal.

6. The method of claim 1 wherein the step of connecting probes to two points on the printed circuit board comprises connecting probes to two points on the printed circuit board to place a capacitance being measured on the printed circuit board in the feedback path of an amplifier within the printed circuit board tester.

7. The method of operating a printed circuit board tester of claim 1 to determine the capacitance between two different points on a printed circuit board, additionally comprising the steps of:

a) connecting the probes to two different points on the printed circuit board;

b) applying an AC stimulus signal between the two points;

c) measuring a response signal between the two points.

8. The method of operating a printed circuit board tester using the method of testing capacitance of claim 1, comprising the steps of:

a) identifying two points on the printed circuit board where current flow therebetween exceeds a predetermined threshold when a stimulus signal is applied;

b) using the method of claim 1 to test the capacitance between the two points; and c) indicating a short circuit between the two points when the computed capacitance is below a predetermined value.

9. A method of operating a printed circuit board tester to test a capacitance between two points, the method comprising the steps of:

a) applying a constant current to the capacitance to be tested;

b) taking initial samples of an output signal across the capacitance;

c) calculating an incremental least squares slope of the output signal;

d) computing an estimate of capacitance based on the slope computed;

e) computing a moving average of computed capacitance estimates;

f) when the computed capacitance estimate and the moving average capacitance estimate have converged to within a predetermined threshold, using the estimate as an indication of the actual capacitance; and g) when the computed capacitance estimate and the moving average capacitance estimate have not converged to within a predetermined threshold, taking further samples of the output signal and repeating steps c) through g).

* * * * *